United States Patent [19]

Gordon

[11] Patent Number: 5,457,371
[45] Date of Patent: Oct. 10, 1995

[54] BINARY LOCALLY-INITIALIZING INCREMENTAL ENCODER

[75] Inventor: Gary B. Gordon, Saratoga, Calif.

[73] Assignee: Hewlett Packard Company, Palo Alto, Calif.

[21] Appl. No.: 107,480

[22] Filed: Aug. 17, 1993

[51] Int. Cl.⁶ .................................................... H03M 1/22
[52] U.S. Cl. ............................ 318/661; 341/2; 250/231.15
[58] Field of Search .................................. 318/600–603, 318/661; 341/2, 11; 250/231.13, 231.14, 231.15, 231.18; 340/825.56, 825.63, 825.65; 324/173–175

[56] References Cited

U.S. PATENT DOCUMENTS

| | | | |
|---|---|---|---|
| 3,484,780 | 12/1969 | Kamoi et al. | 340/347 X |
| 3,500,449 | 3/1970 | Lenz . | |
| 3,525,094 | 8/1970 | Leonard . | |
| 3,846,789 | 11/1974 | Germer et al. | 340/204 X |
| 3,999,022 | 12/1976 | Hosemann | 200/23 |
| 4,041,483 | 8/1977 | Groff . | |
| 4,060,799 | 11/1977 | Jones | 318/692 X |
| 4,183,014 | 1/1980 | McClean et al. | 340/204 |
| 4,363,026 | 12/1982 | Salmon . | |
| 4,730,110 | 3/1988 | Spaulding | 340/825.65 X |
| 5,038,243 | 8/1991 | Gordon | 341/2 |

OTHER PUBLICATIONS

I & CS, Absolute Encoders Find Increased Application, Greg Wolf & Francis Dy, Feb., 1989, pp. 67–69.

Primary Examiner—William M. Shoop, Jr.
Assistant Examiner—Brian Sircus

[57] ABSTRACT

A binary locally-initializing incremental position encoder (112) for determining the position of an object, i.e. a robot arm (102). The inventive position encoder (112) is adapted to be coupled to the object (102) and includes first, second, third and fourth gears (129, 130, 131 and 132, respectively). The gears are such that the positions thereof, representing the positions or states of the object, repeat at binary intervals. That is, the first gear (129) has a first number of teeth $N_1$ and the second gear (130) has a second number of teeth $N_2$. The second gear (130) is driven by the first gear (129) from a first position to a second position. The third gear (131) is mechanically coupled to and coaxial with the second gear (130). The third gear (131) has a third number of teeth $N_3$ and is adapted for rotation in direct angular proportion to any rotation of the second gear (130). The fourth gear (132) has a fourth number of teeth $N_4$ and is driven by the third gear (131). In a specific implementation, each set of gears includes one gear that has a binary number of teeth. The invention also provides a method for designing a position encoder which repeats after an arbitrary predetermined nonprime number of revolutions.

25 Claims, 6 Drawing Sheets

ROTATION #0

FIG. 3b

ROTATION #1

FIG. 3c

ROTATION #256

FIG. 4

| RIGHT GEAR REV # CCW | RIGHT GEAR ANGLE | MIDDLE GEAR ANGLE | MIDDLE GEAR MOD 360 | MIDDLE GEAR TEETH (TO COM-PLTN) | LEFT GEAR ANGLE | LEFT GEAR MOD 360 |
|---|---|---|---|---|---|---|
| 0 | 0 | 0.0 | 0.0 | 0 | 0.0 | 0.0 |
| 1 | 0 | 337.5 | 337.5 | 1 | 316.4 | 316.4 |
| 2 | 0 | 675.0 | 315.0 | 2 | 632.8 | 272.8 |
| 3 | 0 | 1012.5 | 292.5 | 3 | 949.2 | 229.2 |
| 4 | 0 | 1350.0 | 270.0 | 4 | 1265.6 | 185.6 |
| 5 | 0 | 1687.5 | 247.5 | 5 | 1582.0 | 142.0 |
| 6 | 0 | 2025.0 | 225.0 | 6 | 1898.4 | 98.4 |
| 7 | 0 | 2362.5 | 202.5 | 7 | 2214.8 | 54.8 |
| 8 | 0 | 2700.0 | 180.0 | 8 | 2531.3 | 11.3 |
| 9 | 0 | 3037.5 | 157.5 | 9 | 2847.7 | 327.7 |
| 10 | 0 | 3375.0 | 135.0 | 10 | 3164.1 | 284.1 |
| 11 | 0 | 3712.5 | 112.5 | 11 | 3480.5 | 240.5 |
| 12 | 0 | 4050.0 | 90.0 | 12 | 3796.9 | 196.9 |
| 13 | 0 | 4387.5 | 67.5 | 13 | 4113.3 | 153.3 |
| 14 | 0 | 4725.0 | 45.0 | 14 | 4429.7 | 109.7 |
| 15 | 0 | 5062.5 | 22.5 | 15 | 4746.1 | 66.1 |
| 16 | 0 | 5400.0 | 0.0 | 0 | 5062.5 | 22.5 |
| 17 | 0 | 5737.5 | 337.5 | 1 | 5378.9 | 338.9 |
| 18 | 0 | 6075.0 | 315.0 | 2 | 5695.3 | 295.3 |
| 207 | 0 | 69862.5 | 22.5 | 15 | 65496.1 | 336.1 |
| 208 | 0 | 70200.0 | 0.0 | 0 | 65812.5 | 292.5 |
| 209 | 0 | 70537.5 | 337.5 | 1 | 66128.9 | 248.9 |
| 210 | 0 | 70875.0 | 315.0 | 2 | 66445.3 | 205.3 |
| 250 | 0 | 84375.0 | 135.0 | 10 | 79101.6 | 261.6 |
| 251 | 0 | 84712.5 | 112.5 | 11 | 79418.0 | 218.0 |
| 252 | 0 | 85050.0 | 90.0 | 12 | 79734.4 | 174.4 |
| 253 | 0 | 85387.5 | 67.5 | 13 | 80050.8 | 130.8 |
| 254 | 0 | 85725.0 | 45.0 | 14 | 80367.2 | 87.2 |
| 255 | 0 | 86062.5 | 22.5 | 15 | 80683.6 | 43.6 |
| 256 | 0 | 86400.0 | 0.0 | 0 | 81000.0 | 0.0 |

BINARY LOCALLY-INITIALIZING INCREMENTAL ENCODER

BACKGROUND OF THE INVENTION

1. Field of the Invention

The present invention relates to position encoders. More specifically, the present invention relates to digital position encoders used to determine the initial position of servo-mechanisms used in such diverse applications as robotics, machine tools and motorized car seats.

2. Description of the Related Art

Robotic systems typically have one or more movable arms or elements which, in many cases, must be precisely positioned on a repetitive basis for optimal performance. Position encoders are often used to provide an indication of a present position of a robot arm. This position information is compared with a target position to determine any change of position required for a particular operation.

Position encoders are classified as incremental, absolute and quasi-absolute. A typical incremental encoder includes a wheel with tally marks arranged in a circular array about the wheel. A sensor detects the passage of tally marks as the orientation of the wheel is changed. Generally, two sensors are arranged in quadrature so that the direction as well as the magnitude of the orientation change can be determined. The direction determination can be used to select the sign of a bidirectional counter which tracks motion as a function of the passage of tally marks.

An incremental encoder must be initialized relative to an origin to provide information as to absolute position. A method used in some plotters and printers is to slowly traverse the mechanism to one end and trip a micro-switch or opto-sensor. However, in many systems a return to an origin can be unesthetic, wasteful, and even dangerous as the position of the joint being initialized may be unknown. This is especially true for multi-axis robots where the position of one joint is dependent on the, also unknown, positions of other joints.

Absolute position encoders provide a readout of absolute position, thereby avoiding the problem with initialization movements that plagues incremental encoders. Gray encoders provide absolute position reading using multiple tracks of marks and a respective sensor for each track. The marks are designed so that each absolute position is represented by a unique combination of sensor outputs. The number of absolute positions that can be differentiated is limited to $2^n$, where n is the number of tracks. A typical 10-sensor Gray encoder can distinguish 1024 positions. A larger number of positions can be distinguished by using more tracks and sensors. However, the increased number of tracks adds to the manufacturing precision of the encoder since all of the tracks must align with each other, thus making the encoder uneconomical. The large number of sensors required also increases the cost of Gray encoders.

Quasi-absolute encoders require fewer sensors and tracks to provide equivalent position differentiations at the expense of requiring up to one revolution of motion for initialization. In effect, a quasi-absolute encoder distinguishes a certain number of absolute positions and provides additional resolution by interpolating between these positions in a manner similar to an incremental encoder. For example, U.S. Pat. No. 4,041,483 to Groff discloses a quasi-absolute "Groff" encoder which uses six sensors to read two gears, each with two tracks to distinguish 1024 positions. One track of each gear includes an index mark subtending a predetermined angle to indicate the orientation of that gear. The other track of each gear provides incremental interpolation of position for that gear. The gears have different numbers of teeth so that the index marks precess relative to each other during successive revolutions. The spatial phase angle between index marks provides a gross representation of absolute position. Distance from one of the (32) absolute positions is measured incrementally by counting (up to 32) tally marks.

The primary disadvantages of the absolute and quasi-absolute encoders is the limited number of states that can be distinguished. An incremental encoder can distinguish as many states as can be counted by the incorporated counter using a pair of sensors and a single wheel. The encoder wheel can turn as many times as required to cover a full range of motion. With proper gearing, any level of precision can be accommodated.

Theoretically, absolute and quasi-absolute encoders can be scaled and/or used in tandem to distinguish any number of states. However, the bulk, complexity and cost of providing an absolute encoder which distinguishes 1,000,000 states preclude its use in many applications. A comparable limitation applies to the quasi-absolute encoders even though fewer sensors and tracks are required. For example, the Groff encoder requires marks which subtend very precisely defined angles. Providing a Groff encoder which could distinguish 1,000,000 positions by increasing the differentiation provided by the incremental tracks would require very strict manufacturing tolerances to be met. These strict manufacturing tolerances would require high costs and quality control problems. The complexity of the logic and track patterning required for a 1,000,000+ state Groff encoder could present significant design challenges.

Thus, at one time, there was a need in the art for a position encoder which combined the range and precision of an incremental encoder with the convenience of absolute and quasi-absolute encoders. In other words, an encoder was needed which avoided the bulk, expense and complexity of absolute encoders and also avoided the need for a blind return to an initialization position required by incremental encoders. There was a further need for a position encoder which utilized relatively few sensors and required only moderate manufacturing tolerances.

This need was met by the invention disclosed and claimed in U.S. Pat. No. 5,038,243, entitled LOCAL INITIALIZATION FOR INCREMENTAL ENCODER, issued Aug. 6, 1991 to Gary B. Gordon and assigned to the Hewlett-Packard Company, the teachings of which are incorporated herein by reference. This patent discloses a position encoder for monitoring the position of a robot arm which includes an incremental encoder section which can be initialized locally by an initialization section. The initialization section comprises three engaged encoder gears with relative prime numbers of teeth, e.g., 23, 24 and 25 so that respective index apertures of the gears precess with successive revolutions of the gears. Upon startup, the robot arm can be moved sufficiently for all three apertures to be detected so that their relative phase positions can be determined. The relative phases can be used to determine an absolute initialization position. Once this initialization position is determined, robot motions can be tracked using the incremental encoder section.

The self-initializing system of the prior Gordon patent affords an adequate solution for "non-wrap-around" servo systems. Non-wrap-around servos involve primarily linear motion and are typified by X-Y milling tables, aircraft control surface actuators, plotters, lens servos, and vehicle seat position presets. As these systems do not repeat, the range of the encoder need only be greater than the range of travel of the axis.

Wrap-around servos involve rotational motion greater than 360 degrees and are typified by radar antennas, military gun and missile mounts, camera pan mounts, machine-tool rotary index tables, spindle drives, and lathe threading feeds.

Unfortunately, the system of the prior Gordon patent is limited with respect to wrap-around type systems. Such systems normally represent the full 360 degrees of rotation of the load as some integer power of two. A common number of states per revolution is 65536, the 16th power of two, a number that fills a 16-bit accumulator. Such a binary relationship facilitates computational speed and convenience. Inside the microprocessor, rotation is controlled by repetitively adding a fixed increment to an accumulator which becomes the demand signal for the servo. Wrap-around at the 360 degree point is accomplished automatically by simply discarding the accumulator's overflow bit.

As such wrap-around systems usually have binary gear reduction ratios (256:1 for example) between the drive motor and the load being rotated, position encoders are required which repeat at a binary rate. Use of the prior Gordon system for this purpose would require significant changes in the gear box such that the reduction ratio would become some even divisor of 600, such as 300:1. These changes would be undesirable for the usual binary servosystem.

Binary encoders are known in the art. Conventional binary encoders are typically constructed with cascaded multi-stage gear boxes with high reduction ratio gears. Unfortunately, the conventional binary encoders are generally complex, elaborate and expensive structures which require precise alignment, numerous opto-sensors and many electrical connections.

Accordingly, a need remains in the art for a simple, inexpensive binary locally-initializing incremental encoder which allows for an ease of alignment in manufacturing and which does not require numerous opto-sensors or electrical connections.

SUMMARY OF THE INVENTION

The need in the art is addressed by the present invention. In a most general sense, the invention provides a binary locally-initializing incremental position encoder for determining the position of an object, i.e. a robot arm. The inventive position encoder is adapted to be coupled to the object and includes first, second, third and fourth gears. The gears are such that the positions thereof, representing the positions or states of the object, repeat at binary intervals. That is, the first gear has a first number of teeth $N_1$ and the second gear has a second number of teeth $N_2$. The second gear is driven by the first gear from a first position to a second position. The third gear is mechanically coupled to and coaxial with the second gear. The third gear has a third number of teeth $N_3$ and is adapted for rotation in direct angular proportion to any rotation of the second gear. The fourth gear has a fourth number of teeth $N_4$ and is driven by the third gear.

In practice, the encoder is adapted for use with a first measurement mechanism for determining the position of each gear at the second position and providing a first signal in response thereto. The signal is then used to compute the position of the object. This is achieved with the use of apertures, opto-sensors, a processor in a unique manner.

The invention also provides a method for designing a position encoder which repeats after an arbitrary predetermined nonprime number of revolutions.

DESCRIPTION OF THE INVENTION

Illustrative embodiments and exemplary applications will now be described with reference to the accompanying drawings to disclose the advantageous teachings of the present invention.

Figure 1:
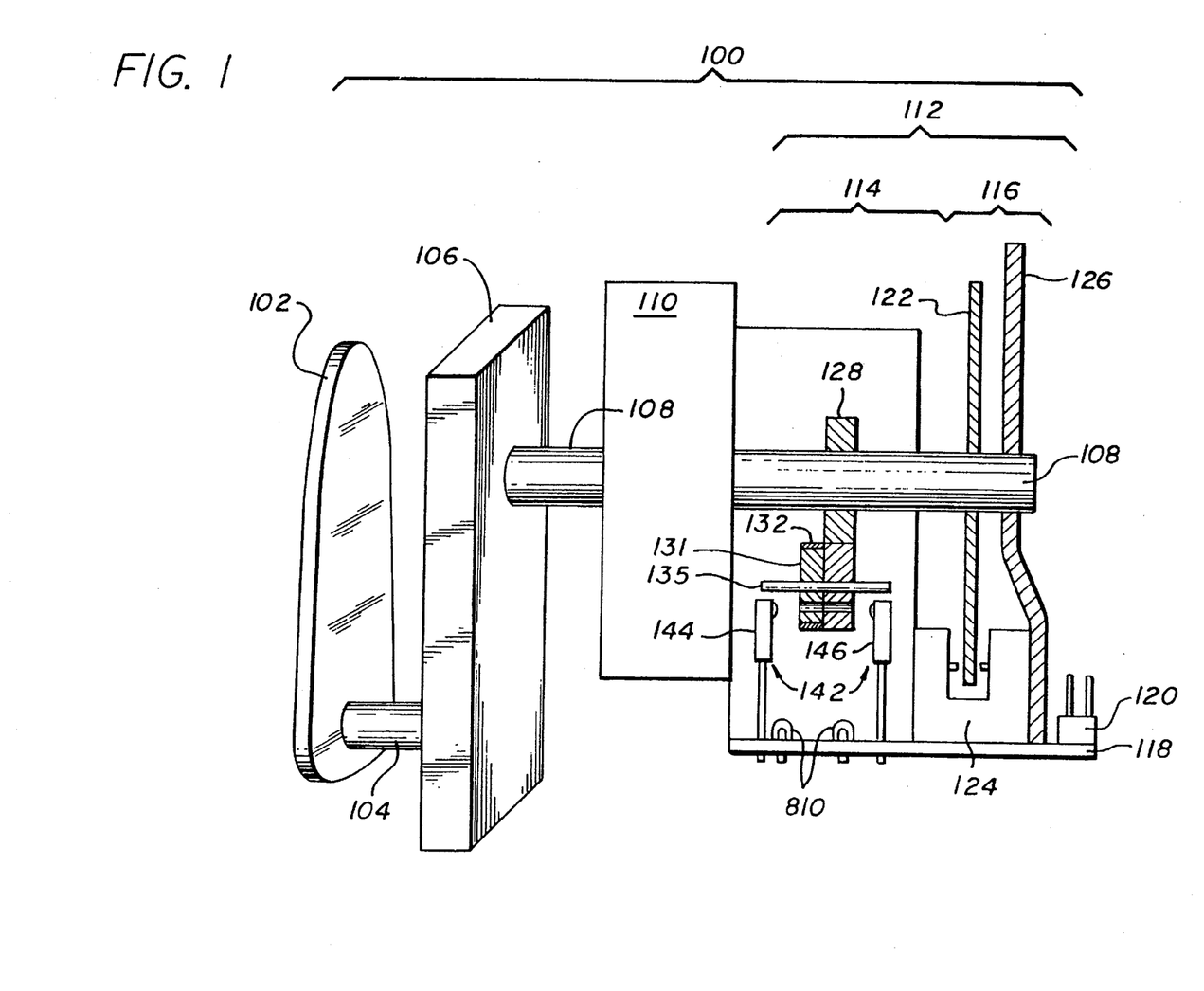
FIG. 1 is a simplified sectional side view of a servoed mechanical system including the encoder of the present invention.

FIG. 1 is a simplified sectional side view of a servoed mechanical system 100 including the encoder 112 of the present invention. The servoed mechanical system 100 includes a robot arm 102, a load shaft 104, reduction gearing 106, a motor shaft 108, a motor 110, and a position encoder 112. The position encoder 112 determines and tracks the position of the robot arm 102 which is driven by the motor 110. The motor 110 and the motor shaft 108 must turn many times to move the robot arm 102 through its range due to the effect of the reduction gears 106. Therefore, it is necessary to ascertain the revolution number as well as the motor shaft orientation to determine robot arm position. The term "rotational position", as used herein, refers to the position of the motor shaft measured in degrees and can assume any real number value, most often including values well in excess of 360°. The term "orientation" refers to rotational position within one revolution, i.e., rotational position modulo 360°. The rotational position in degrees of the motor shaft 108 can be calculated as the sum of its current orientation and a revolution number times 360°.

The position encoder 112 includes an initialization section 114 and an incremental encoder section 116. The initialization section 114 determines an initial rotational position of the motor shaft 108. Thereafter, the incremental encoder section 116 tracks changes of rotational position in a conventional manner. The position encoder 112 further includes a circuit board 118 for electrically interfacing the position encoder 112 to a motion control microcomputer via a connector 120. The incremental encoder section 116, which in the preferred embodiment is a model HEDS-9100 incremental encoder made and sold by the Hewlett-Packard company, comprises a code wheel 122, and an incremental sensor module 124. A metal shield 126 provides mechanical protection for the code wheel 122. The module 124 includes a pair of sensors arranged in quadrature for detecting the passage of tally apertures 127 which are arranged in a circular array about the code wheel 122 as illustrated in the front perspective view of the encoder of FIG. 2.

The initialization section 114 comprises a drive gear 128 which is mounted on the motor shaft 108. The drive gear 128 is adapted to engage the second gear 130 of an arrangement of four gears as shown more clearly in FIG. 2. The first gear 129 in the arrangement is mounted on a first shaft 133. The second gear 130 is mounted on a second shaft 135 and engages the first gear 129. A third gear 131 is mounted on the second shaft 135 coaxial with the second gear 130. A fourth gear 132 is mounted on a third shaft 137 for engagement with the third gear 131. A first aperture 136 is provided in the first gear 129. The apertures of the second and third gears 130 and 131 are aligned to provide a single aperture 138. An aperture 140 is also provided in the fourth gear 132.

A particularly novel and advantageous teaching of the present invention is that the sizes of the four gears 129, 130, 131 and 132 in the arrangement, with respect to the circumferential extent or the number of gears thereof, are such that the positions of the gears, as indicated by the apertures, repeat after a binary number of revolutions of the motor shaft 108. With each set or pair of interlocking gears, one of the gears has a binary number of teeth, i.e., $2^n$ where n is any positive integer. The number of teeth in the other interlocking gear may be $2^n \pm 1$ or other possible numbers within the general constraint that the positions of the gears repeat after a binary number of rotations of the motor shaft 108. In the illustrative embodiment of FIG. 2, for example, the drive gear 128 has 31 teeth, the first gear 129 in the four gear arrangement has 31 teeth, the second gear has 32 teeth, the third gear has 31 teeth and the fourth gear has 32 teeth. Other gear ratios may be used as well, e.g., 16:15 and 8:7. Further a gear ratio of $2^n:2^{n-1} -1$ may be found suitable for this purpose. Those skilled in the art will appreciate that the ratios selected will affect the repetition intervals. Additional gears may be cascaded to further extend the repetition intervals.

Returning briefly to FIG. 1, the initialization section 114 further includes a first index sensor 142 for detecting when the second index aperture 138 of the second and third gears 130, 131 is aligned therewith. The sensor 142 includes an emitter 144 and a detector 146 on opposite sides of the gear(s). The gear blocks light emitted from the emitter 144 until the aperture is in alignment so that the light can pass therethrough to be detected by an associated detector 146.

Figure 2:
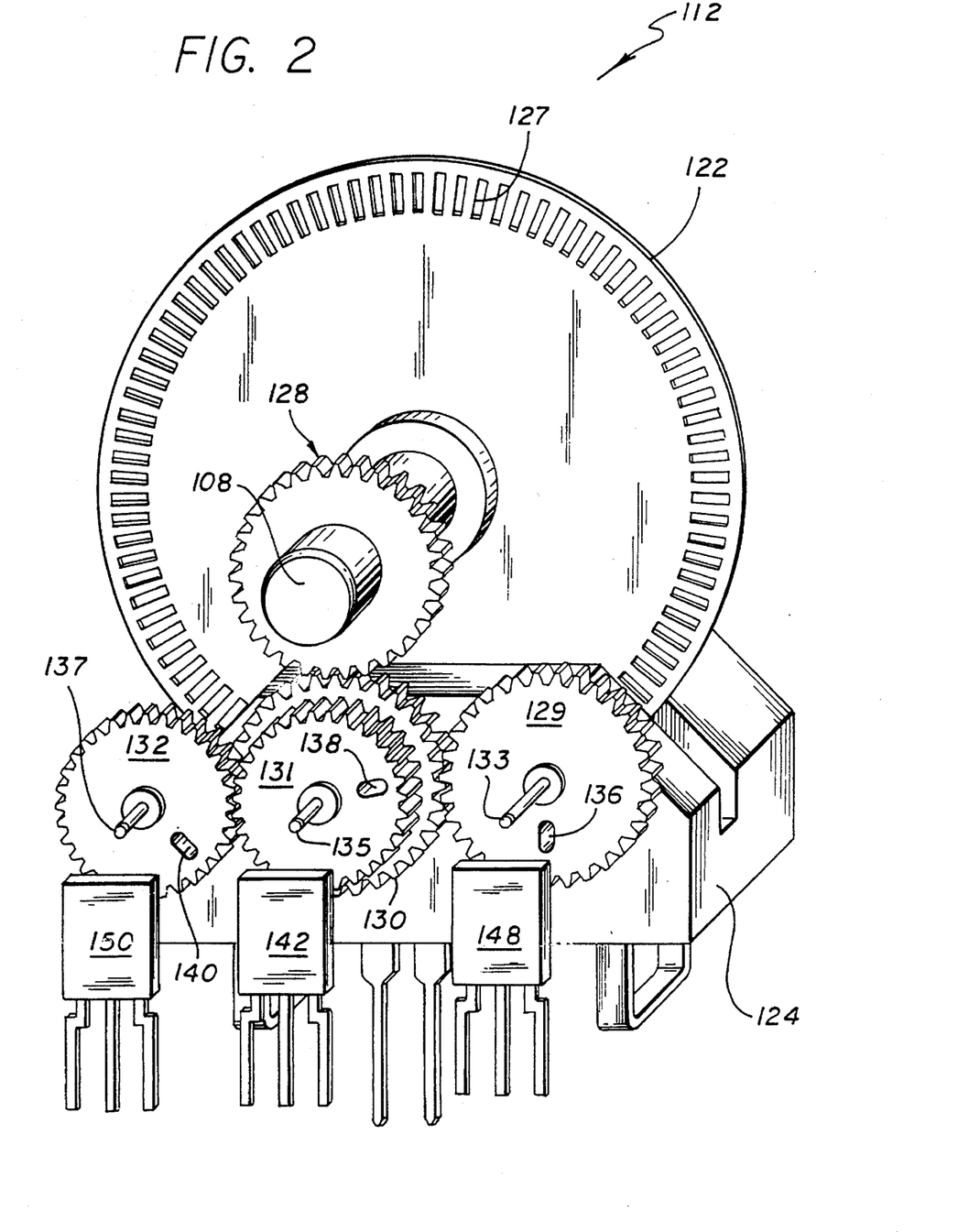
FIG. 2 is a front perspective view of the binary locally initializing encoder of the present invention.

Similarly, as illustrated in FIG. 2, a second index sensor 148 is used to detect alignment of the first aperture 136 of the first gear 129 and a third index sensor 150 provided to detect alignment of a third aperture 140 of the third gear 132.

Figure 3A:
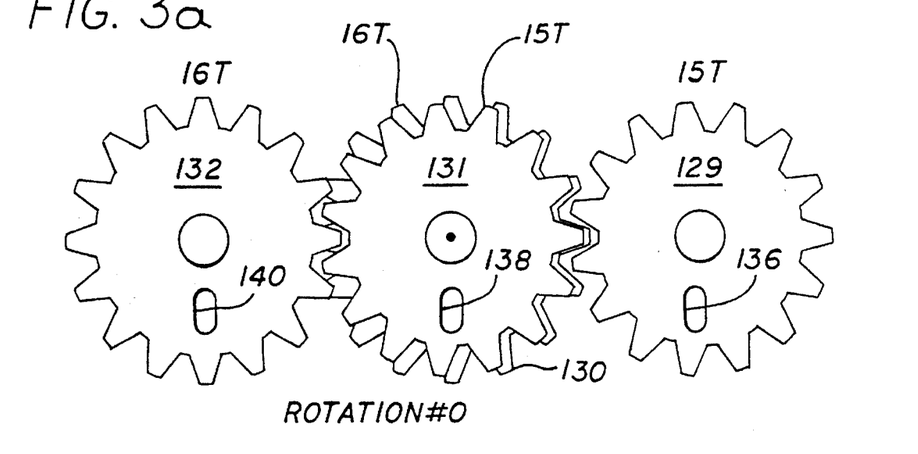
FIG. 3a shows the relative orientations of the gears of the position encoder of the present invention prior to any rotation of the motor shaft.
Figure 3B:
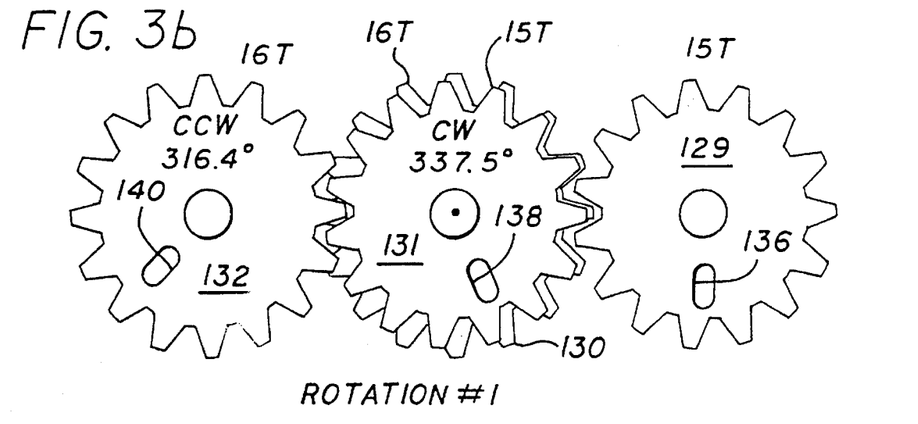
FIG. 3b shows the relative orientations of the gears of the position encoder of the present invention after one complete rotation of the motor shaft.
Figure 3C:
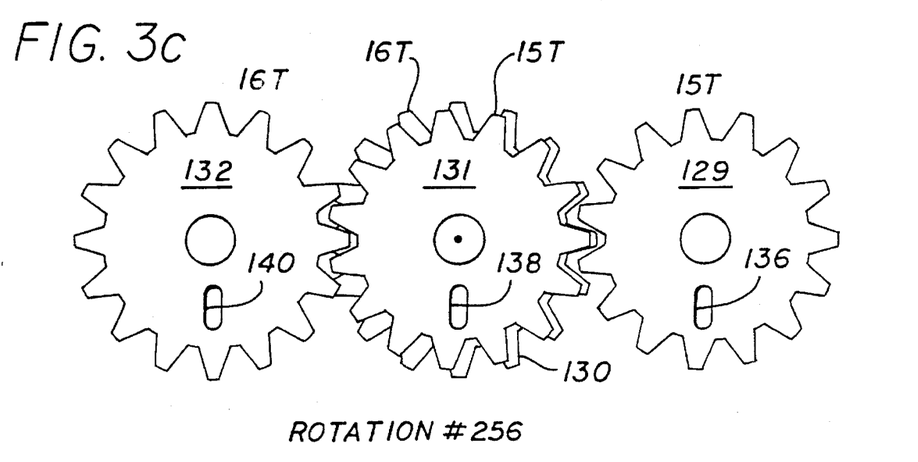
FIG. 3c shows the relative orientations of the gears of the position encoder of the present invention after 256 complete rotations of the motor shaft.

FIGS. 3a–3c depict selective relative orientations of gears of a position encoder constructed in accordance with the present teachings initially and after 1 and 256 rotations, respectively, of the motor shaft 108. In FIGS. 3a–3c, the first gear 129 has 15 teeth, the second gear 130 has 16 teeth, the third gear 131 has 15 teeth and the fourth gear 132 has 16 teeth. Thus, FIGS. 3a–3c show three of the 256 possible alignments of encoder gears 129, 131 and 132 that can be resolved by the initialization section 114 of the invention. That is, FIG. 3a shows the relative orientations of the gears prior to any rotation of the motor shaft 108. The index apertures 136, 138 and 140 of the gears 129, 131 and 132, respectively, are aligned with the sensors 148, 142 and 150 respectively. This is arbitrarily assigned to represent a zero point for measuring angular rotation for the robot arm 102, motor shaft 108, wheel 122, and gears 129, 130, 131 and 132.

FIG. 3b shows the relative orientations of the gears after one complete counterclockwise rotation of the motor shaft 108.

FIG. 3c shows the relative orientations of the gears after 256 complete rotations of the motor shaft 108.

As discussed more fully in the above-noted Gordon patent (U.S. Pat. No. 5,038,243), an initial revolution number can be determined by comparing the spatial phases of the index apertures 136, 138 and 140. Spatial phase comparison requires detection of each aperture. Detection requires sufficient rotation so that each index aperture is detected by its respective sensor. Relative phases are measured by the number of tally aperture detections between index mark detections. The relative phases can then be used to calculate an initial rotational position for the robot arm 102. Subsequent movements of the robot arm 102 can then be tracked by the incremental encoder section 116.

Figure 4:
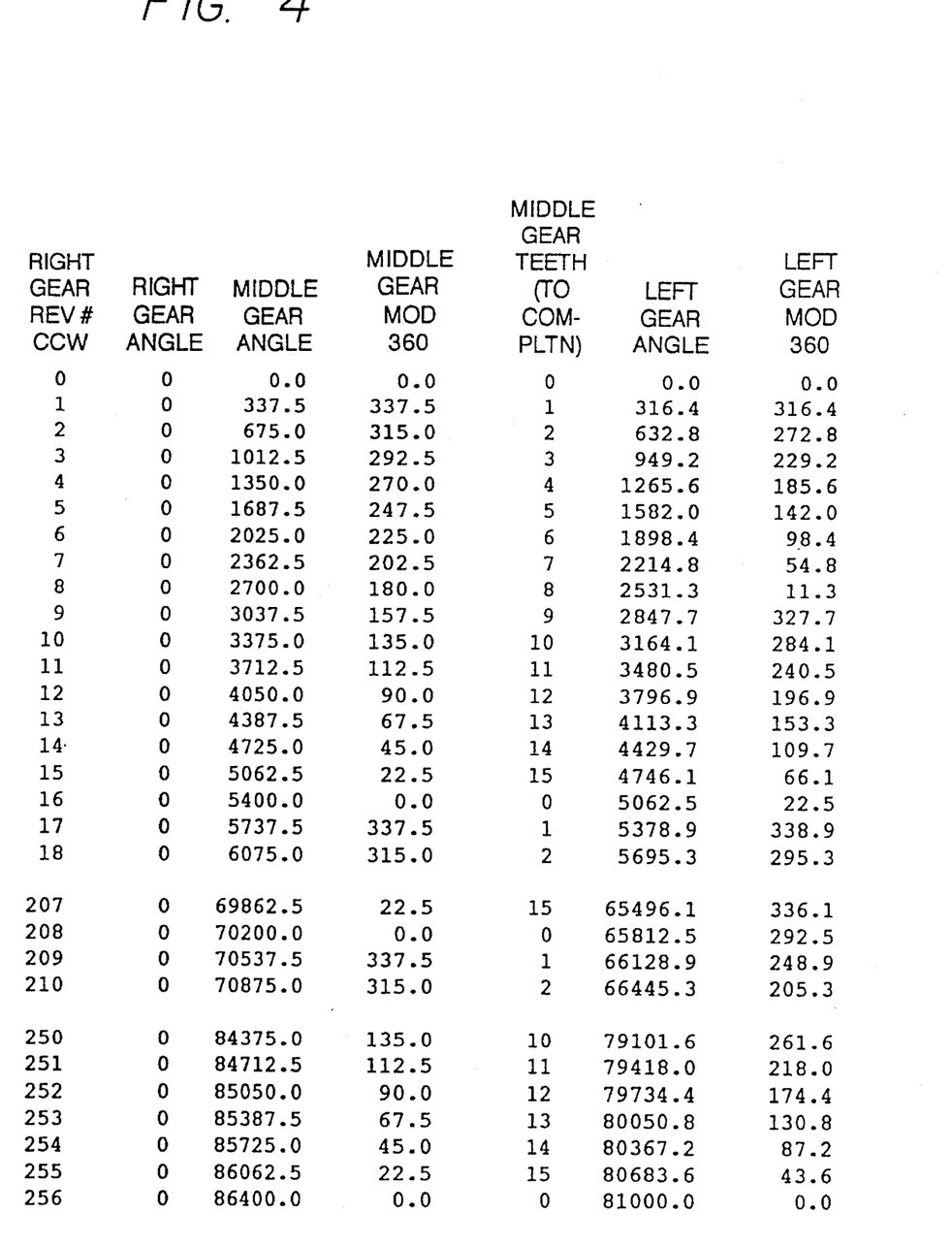
FIG. 4 is a table of representative position determinations using the gearing arrangement of the illustrative embodiment of FIGS. 3a–3c.

One way to decode the spatial phases so determined is to use a table such as that partially shown in FIG. 4. FIG. 4 is a table of representative position determinations using the gearing arrangement of the illustrative embodiment of FIGS. 3a–3c. The table can be coded in ROM and the phase determinations used as addresses. The phases represented in FIGS. 3a–3c are underlined.

Figure 5:
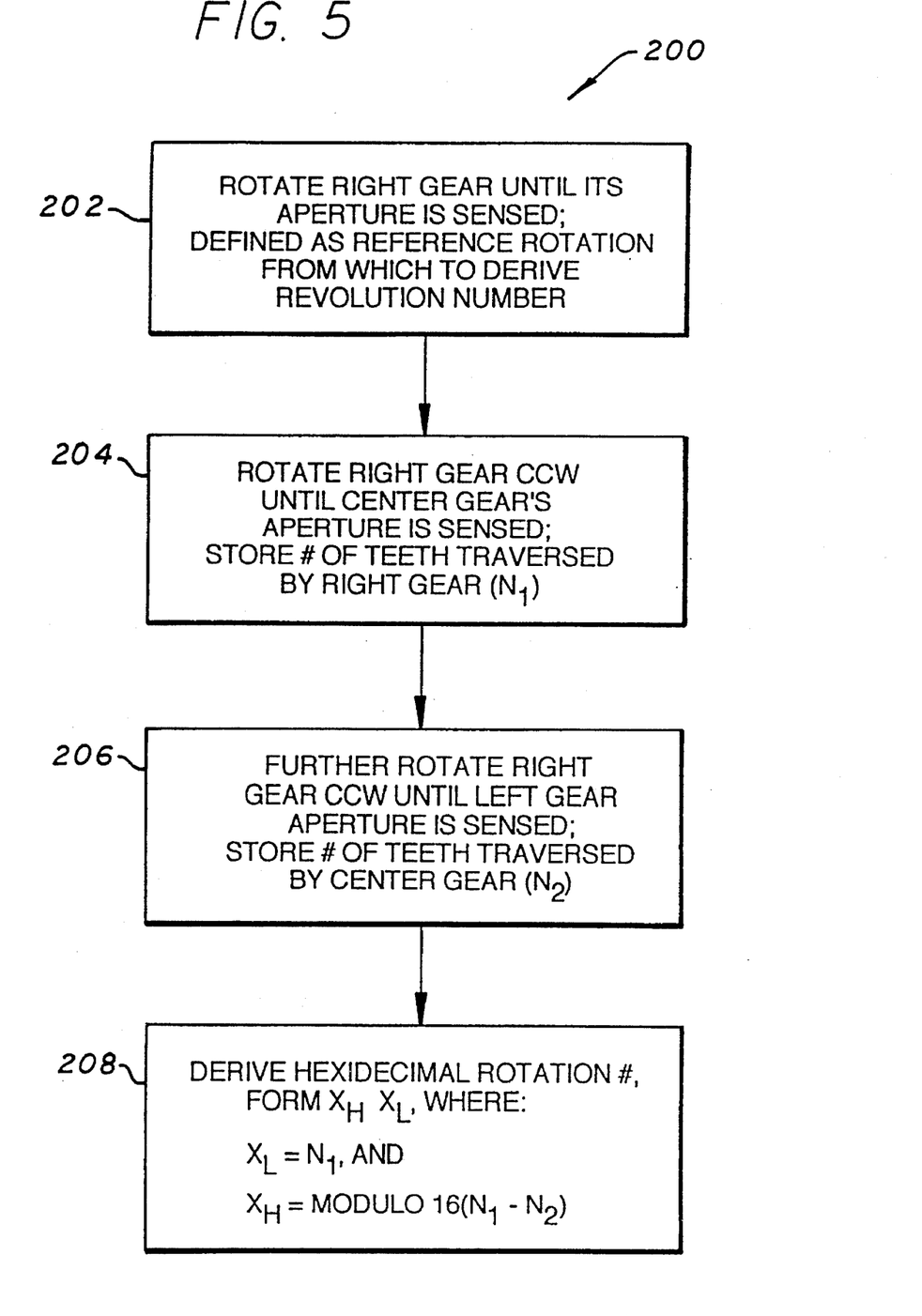
FIG. 5 is a flow diagram of a method for initializing the position encoder of the present invention.

FIG. 5 is a flow diagram of a method 200 for initializing the position encoder of the present invention. In the first step 202, the motor 110 drives the gear assembly until the first aperture 136 of the first gear 129 is sensed. At the next step 204, the first gear 129 is rotated counterclockwise until the second aperture 138 in gears 130 and 131 is sensed. The number of teeth traversed by the first gear 129 is stored as $N_1$. At the next step 206, the first gear 129 is rotated further until the third aperture 140 in the third gear 132 is sensed. The number of teeth traversed by the second gear 130 is stored as $N_2$. Finally, at step 208, the hexadecimal rotation number $X_H, X_L$ is determined in accordance with the algorithm $$X_L = N_1$$

$$X_H = \text{modulo } 16\ (N_1 - N_2) \qquad [1]$$

where $X_L$ represents the lower nibble of the hexadecimal byte and $X_H$ represents the upper nibble of the hexadecimal byte.

Figure 6:
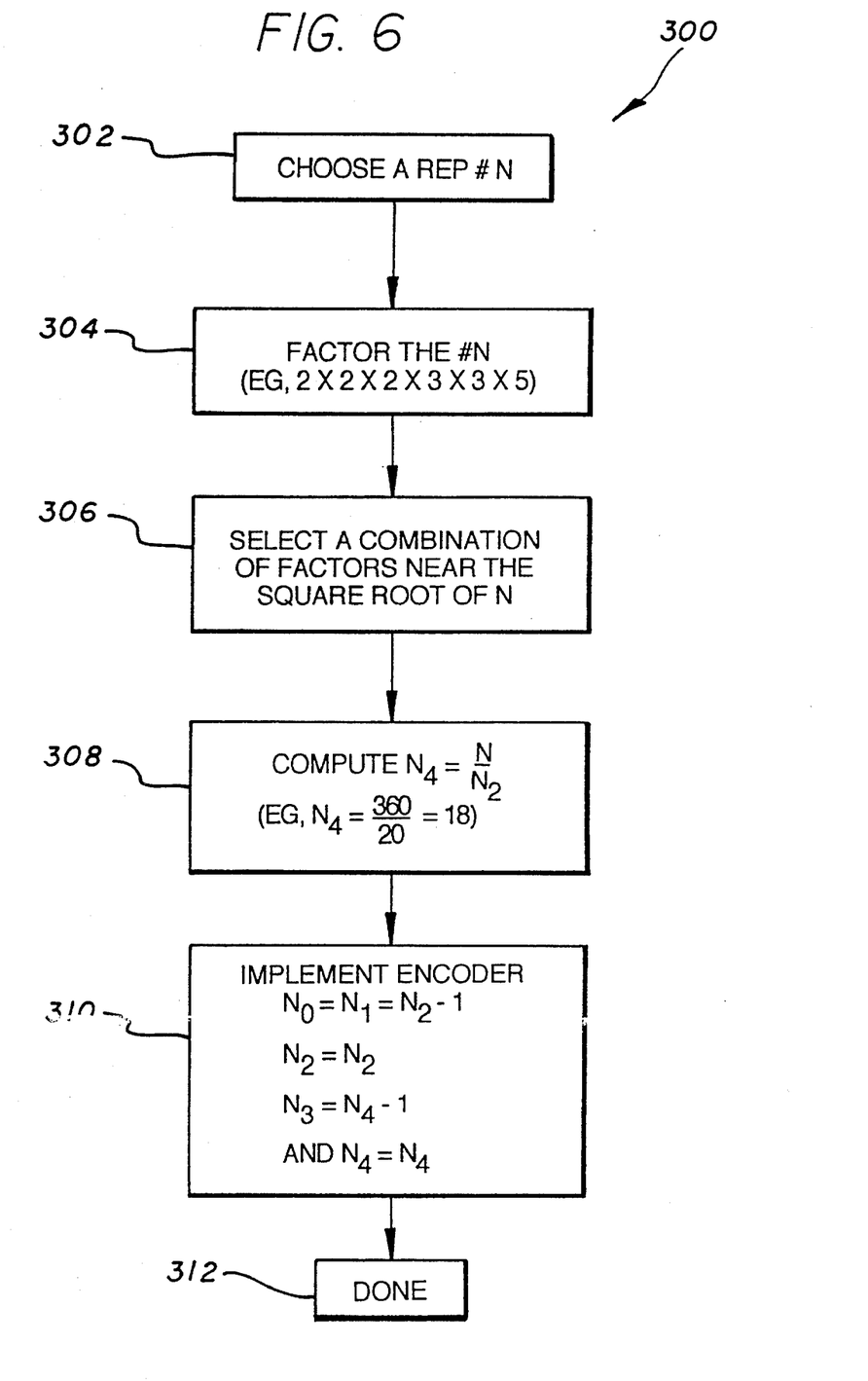
FIG. 6 is a flow diagram of a method for designing a position encoder which repeats at an arbitrary predetermined nonprime number of revolutions.

FIG. 6 is a flow diagram of a method 300 for designing an encoder to repeat after an arbitrary yet predetermined nonprime number of N revolutions. The method includes a first step 302 at which the number N (e.g., 360) is chosen. Next, at step 304, the number is factored. For N=360, the factors are 2×2×2×3×3×5=360. Next, at steps 306 and 308, two numbers are chosen out of the set of factors which are close to each other which produce a product equal to N. For example, the first number may be close to the square root of N, i.e., 18.97. Thus, 2×2×5 or 20 is selected as the first number $N_2$. The second number $N_4$ is then:

$$N_4 = N/N_2 \qquad [2]$$

With the illustrative values of N=360 and $N_2$=20, $N_4$ =18 in accordance with equation [2]. Next, at step 310, a gear arrangement such as that shown in FIGS. 3a–3c is designed with fourth and second gears having a number of teeth equal to the numbers $N_4$ and $N_2$ or integer multiples thereof, respectively. The number of teeth $N_1$ in the first gear is one less than the number of teeth $N_2$ in the second gear or 19. Likewise, the number of teeth $N_3$ in the third gear is one less than the number of teeth $N_4$ in the fourth gear or 17. The number of teeth in the drive gear $N_0$ is set equal to the number of teeth in the first gear $N_1$. Thus, the gear arrangement is designed in accordance with the arrangement of FIG. 2 and FIG. 3 with $N_0=19$, $N_1=19$, $N_2=20$, $N_3=17$ and $N_4=18$.

The design and operation of a circuit for decoding the phase information is provided in the above-noted U.S. Pat. No. 5,038,243, the teachings of which are incorporated herein by reference.

Those skilled in the art will appreciate that other factors (e.g., minimum and maximum numbers of gears) may be used to design a practical gear arrangement.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A binary locally-initializing incremental position encoder for determining the position of an object after said object has moved from a first position to a second position, said encoder being coupled to said object and comprising:

a first gear having a first number of teeth $N_1$;

a second gear having a second number of teeth $N_2$, said second gear being interlockingly coupled to said first gear and driven from a first position to a second position by the movement of said object from said first position to said second position;

a third gear mechanically coupled to and coaxial with said second gear, said third gear having a third number of teeth $N_3$ and movable in one to one direct angular proportion to any movement of said second gear; and a fourth gear having a fourth number of teeth $N_4$ and being interlockingly driven by said third gear, said first, second, third and fourth numbers of teeth being such that the angular positions of said first, second, third and fourth gears repeat after an integer power of two number of rotations;

such that the ratio of the number of teeth in each pair of interlocking gears is one of $2^n:2^n\pm 1$ and $2^n:2^{n-1}-1$ wherein n is an integer.

2. The invention of claim 1 further including first measurement means for determining the position of each gear and providing a first signal in response thereto.

3. The invention of claim 1 further including motive means for moving at least one of said gears from said first position to said second position.

4. The invention of claim 2 further including second measurement means for ascertaining the degree of movement of said object from said first position to said second position and providing a second signal in response thereto.

5. The invention of claim 4 wherein said second measurement means includes an incremental encoder for tracking the position of said object.

6. A binary locally-initializing incremental position encoder for determining the position of an object after said object has moved from a first position to a second position, said encoder being coupled to said object and comprising:

a first gear having a first number of teeth $N_1$;

a second gear having a second number of teeth $N_2$, said second gear being interlockingly coupled to said first gear and driven from a first position to a second position by the movement of said object from said first position to said second position;

a third gear mechanically coupled to and coaxial with said second gear, said third gear having a third number of teeth $N_3$ and movable in one to one direct angular proportion to any movement of said second gear;

a fourth gear having a fourth number of teeth $N_4$ and being interlockingly driven by said third gear, said first, second, third and fourth numbers of teeth being such that the angular positions of said first, second, third and fourth gears repeat after an integer power of two number of rotations; and measurement means for determining the position of each gear and providing a signal in response thereto, the measurement means including means for detecting the angular position of said first gear, means for detecting the angular position of said second gear, and means for detecting the angular position of said fourth gear, said means for detecting the angular position of said second gear including means for detecting the angular position of said third gear, wherein each gear includes an aperture.

7. The invention of claim 6 wherein said means for determining the position of each gear includes a photosensor mounted to receive light from a light source when each gear is in a predetermined position.

8. The invention of claim 7 further including means for detecting any rotation of said first, second, third and fourth gears.

9. The invention of claim 8 further including processor means for computing an initial position of an object based on the rotation of said first, second, third and fourth gears to the point of activation of said first, second, third and fourth photosensors.

10. The invention of claim 9 wherein said first and second gears provide a first set of gears and said third and fourth gears provide a second set of gears and each set of gears includes one gear that has an integer power of two number of teeth.

11. A binary position encoder for determining the position of an object, said position encoder being coupled to said object and comprising:

a first gear having a first number of teeth;

a second gear coupled to said first gear and having a second number of teeth;

a third gear attached to said second gear and having said first number of teeth;

a fourth gear coupled to said third gear and having said second number of teeth, said first and second number of teeth being such that the angular positions of said first, second, third and fourth gears repeat after an integer power of two number of rotations;

wherein said first and second gears provide a first set of gears and said third and fourth gears provide a second set of gears and each set of gears includes one gear that has an integer power of two number of teeth such that the ratio of the number of teeth in each set of interlocking gears is one of $2^n:2^n\pm 1$ and $2^n:2^{n-1}-1$ wherein n is an integer, the gears being driven in response to movement of the object; and first measurement means for determining the position of each gear and providing a first signal in response thereto.

12. The invention of claim 11 wherein said first measurement means includes means for detecting the angular position of said first gear.

13. The invention of claim 12 wherein said first measurement means includes means for detecting the angular position of said second gear.

14. The invention of claim 13 wherein said means for detecting the angular position of said second gear includes means for detecting the angular position of said third gear.

15. The invention of claim 14 wherein said first measurement means includes means for detecting the angular position of said fourth gear.

16. The invention of claim 11 further including motive means for moving at least one of said gears from a first position to a second position.

17. The invention of claim 11 further including second measurement means for ascertaining the degree of movement of said object from a first position to a second position and providing a second signal in response thereto.

18. The invention of claim 17 wherein said second measurement means includes an incremental encoder for tracking the position of said object.

19. A binary position encoder for determining the position of an object, said position encoder being coupled to said object and comprising:

a first gear having a first number of teeth;

a second gear coupled to said first gear and having a second number of teeth;

a third gear attached to said second gear and having said first number of teeth;

a fourth gear coupled to said third gear and having said second number of teeth, said first and second number of teeth being such that the angular positions of said first, second, third and fourth gears repeat after an integer power of two number of rotations; wherein said first and second gears provide a first set of gears and said third and fourth gears provide a second set of gears and each set of gears includes one gear that has an integer power of two number of teeth, said gears move in response to movement of the object; and measurement means for determining the position of each gear and providing a signal in response thereto, the measurement means including means for detecting the angular portion of said first gear, means for detecting the angular position of said second gear, and means for detecting the angular position of said fourth gear, said means for detecting the angular position of said second gear including means for detecting the angular position of said third gear, wherein each gear includes a fiducial mark.

20. The invention of claim 19 wherein the fiducial mark is an aperture.

21. The invention of claim 20 wherein said means for detecting the angular position of said fourth gear is an incremental encoder.

22. The invention of claim 21 wherein each means for detecting the angular position of each gear includes a photosensor mounted to receive light from a light source when each gear is in a predetermined position.

23. The invention of claim 22 further including means for detecting any rotation of said first, second, third and fourth gears.

24. The invention of claim 22 further including processor means for computing an initial position of an object based on the rotation of said first, second, third and fourth gears to the point of activation of said first, second, third and fourth photosensors.

25. A method for designing an incremental encoder for determining the position of an object, said encoder being coupled to said object and comprising:

a first gear having a first number of teeth $N_1$;

a second gear having a second number of teeth $N_2$, said second gear being driven by said first gear from a first position to a second position;

a third gear mechanically coupled to and coaxial with said second gear, said third gear having a third number of teeth $N_3$ and movable in one to one direct angular proportion to any movement of said second gear; and a fourth gear having a fourth number of teeth $N_4$ and being driven by said third gear, said first, second, third and fourth numbers of teeth being such that the angular positions of said first, second, third and fourth gears repeat after an arbitrary predetermined nonprime number of rotations N, said method including the steps of:

factoring the number N to create a set of factors;

selecting numbers $N_2'$ and $N_4'$ such that the product thereof is equal to N;

selecting $N_2$ equal to an integer multiple of $N_2'$;

selecting $N_4$ equal to an integer multiple of $N_4'$;

selecting $N_1 = N_2 - 1$; and selecting $N_3 = N_4 - 1$;

where $N_1$, $N_2$, $N_3$ and $N_4$ are the number of teeth in the first, second, third and fourth gears respectively.

* * * * *